United States Patent [19]

Lynch et al.

[11] Patent Number: 5,630,905
[45] Date of Patent: May 20, 1997

[54] METHOD OF FABRICATING QUANTUM BRIDGES BY SELECTIVE ETCHING OF SUPERLATTICE STRUCTURES

[75] Inventors: William T. Lynch, Apex, N.C.; Kang L. Wang, Santa Monica; Martin O. Tanner, Duarte, both of Calif.

[73] Assignee: The Regents of the University of California, Los Angeles, Calif.

[21] Appl. No.: 465,493

[22] Filed: Jun. 5, 1995

Related U.S. Application Data

[62] Division of Ser. No. 384,166, Feb. 6, 1995, Pat. No. 5,539,214.

[51] Int. Cl.$^6$ ................................................ H01L 21/20
[52] U.S. Cl. ........................ 438/507; 438/49; 438/94; 438/752; 438/753; 438/750
[58] Field of Search .......................... 156/643.1, 649.1, 156/650.1, 655.1, 657.1; 437/228, 233, 234

[56] References Cited

U.S. PATENT DOCUMENTS

| | | | |
|---|---|---|---|
| 4,983,540 | 1/1991 | Yamaguchi et al. | 437/110 |
| 5,357,119 | 10/1994 | Wang et al. | 257/18 |
| 5,383,212 | 1/1995 | Knox et al. | 372/45 |
| 5,427,977 | 6/1995 | Yamada et al. | 437/127 |

*Primary Examiner*—John A. McPherson
*Attorney, Agent, or Firm*—Townsend and Townsend and Crew LLP; Henry K. Woodward

[57] ABSTRACT

A quantum bridge structure including wires of a semiconductor material such as silicon which are formed by selectively etching a superlattice of alternating layers of at least two semiconductor materials. The quantum bridge is useful as a photo emission device, a photo detector device, and a chemical sensor. The wires exhibit improved electrical conduction properties due to decreased Coulomb scattering.

14 Claims, 4 Drawing Sheets

METHOD OF FABRICATING QUANTUM BRIDGES BY SELECTIVE ETCHING OF SUPERLATTICE STRUCTURES

This is a division of application Ser. No. 08/384,166, filed Feb. 6, 1995, now U.S. Pat. No. 5,539,214.

BACKGROUND OF THE INVENTION

This invention relates generally to bandgap engineered semiconductor structures and more particularly the invention relates to structures having dimensions sufficiently small so as to confine carriers located therein and resulting in novel electronic and optical properties.

There has been considerable attention paid to quantum wires since their proposal by H. Sakaki in the *Jap. J. Appl. Phys.* 19, L735–738 (1980). More recently, Canham in *Appl. Phys. Lett.* 57, 1046 (1990) has observed strong photoluminescence in anodically etched silicon, or porous silicon. The structure of this silicon resembles a sponge, composed of a myriad of silicon quantum dots or intertwined quantum wires.

Considerable work has been done in light emission from silicon. Currently, group IV semiconductors (silicon and germanium) are not used in lasers and light emitting diodes even though the materials are widely used for their electrical properties. A silicon based light emitting diode or laser would be a tremendous boon to the semiconductor industry with speed significantly improved over those of electrical conduction. The current research in silicon light emission has been in the area of porous silicon of the type noted above.

It has also been shown that quantum wires may show significant improvements in transport properties over bulk semiconductors due to decreased Coulomb scattering. Many other novel effects related to the quantum confinement have been reported such as non-local bend resistance, the quenching of the Hall effect, and the oscillatory behavior of capacitance and conductivity. Further, the optical properties of porous silicon can be combined with the improved electrical property to function as sensors.

Heretofore, quantum wire superlattices in gallium arsenide/aluminum gallium arsenide have been proposed for 8–20 micrometer photodetectors. A theoretical study of p-i-n GaAs/AlGaAs quantum wire detectors proposes that they may perform better than bulk devices due to increased absorption of photons and the higher carrier mobilities therein. See D. L. Crawford et al., Applied Physics Letters, 58 (1991), p. 1629.

The present invention is directed to the fabrication of a quantum bridge structure whose length, width, and height can be controlled by processing parameters. The resulting structure can exhibit photoluminescence and electroluminescence which allows the device to function in a light emitter, light detector, conductive wire, and a sensor mode.

SUMMARY OF THE INVENTION

In accordance with the invention, quantum bridges are provided by the selective etching of superlattice structures. By carefully controlling the process parameters, the physical dimensions as well as the photoluminescence and electroluminescence of the bridge structure can be readily varied. The resulting structure can then be employed in various applications of light emission, light detection, and electrical conduction.

In accordance with a preferred embodiment, the process in fabricating the quantum bridge structure begins with a supporting substrate of silicon or other material on which a silicon buffer layer can be epitaxially grown. For stress relief, a graded silicon to $Si_xGe_{1-x}$ buffer layer is then epitaxially grown on the silicon buffer layer. A superlattice structure of alternating silicon and germanium layers is then grown on the silicon/germanium buffer layer.

The bridge structure is then formed by selectively etching trenches through the superlattice structure using E-beam or I-beam photolithography and plasma etching. Germanium material between the silicon wires is then removed by selective wet etching. Contacts at either end of the wire structure are formed by high energy ion implantation into supporting superlattice columns.

The invention and objects and features thereof will more readily apparent from the following detailed description and dependent claims when taken with the drawing.

DESCRIPTION OF THE PREFERRED EMBODIMENT

Figure 1:
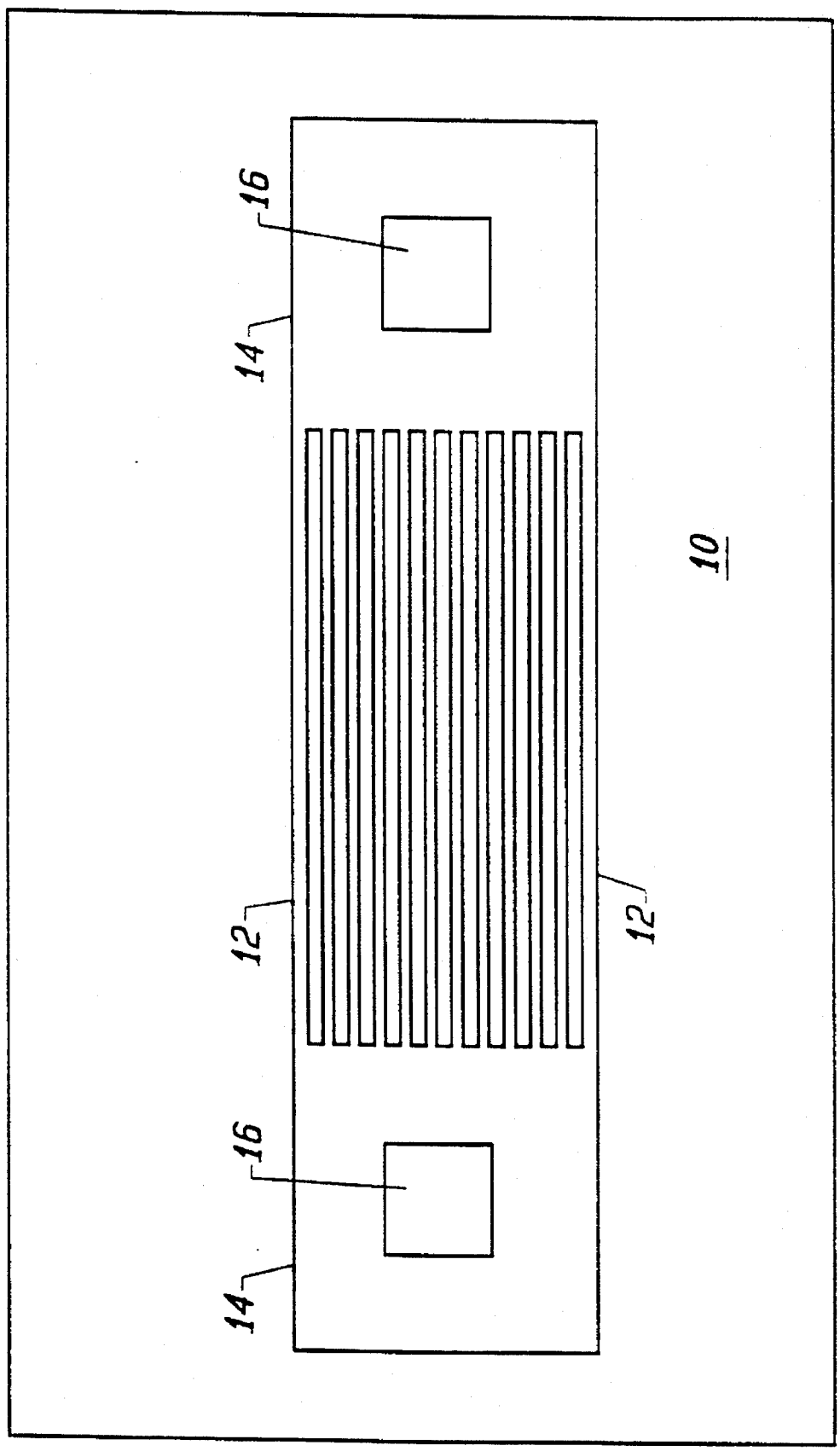
FIG. 1 is a top view of a quantum bridge structure in accordance with one embodiment of the invention.
Figure 2:
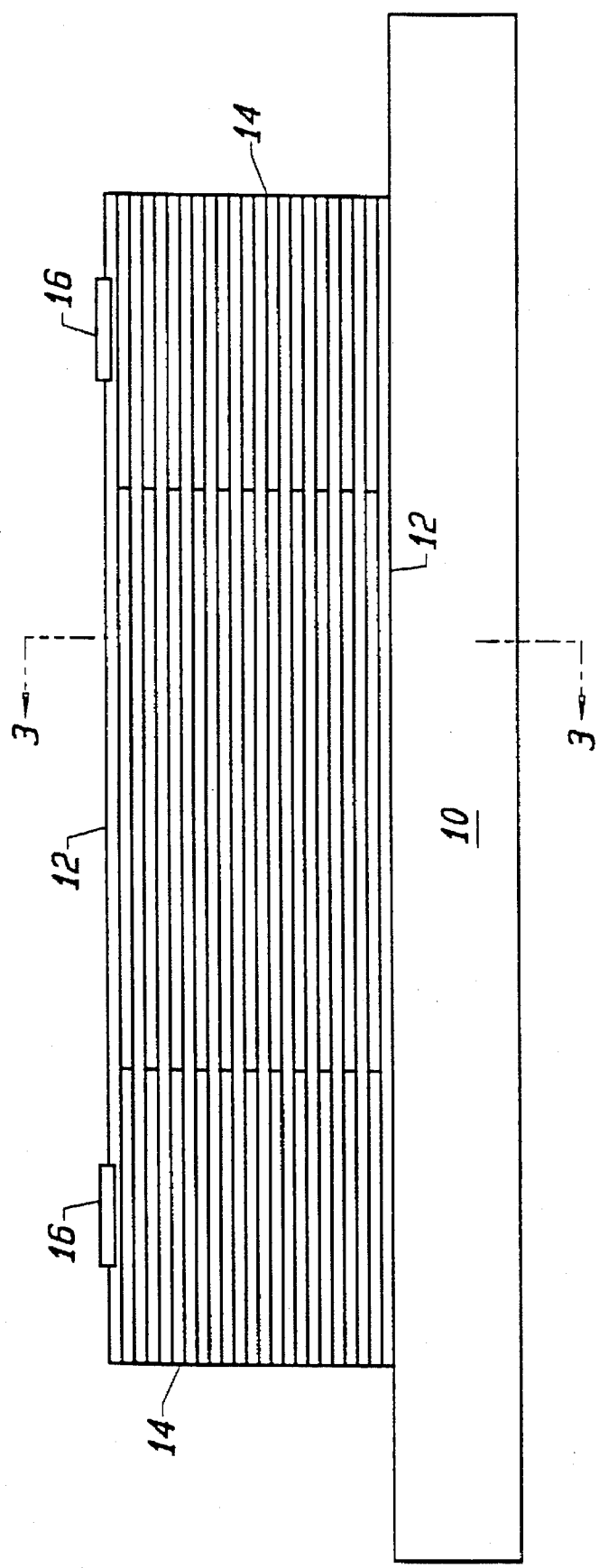
FIG. 2 is a side view of the quantum bridge structure of FIG. 1.
Figure 3:
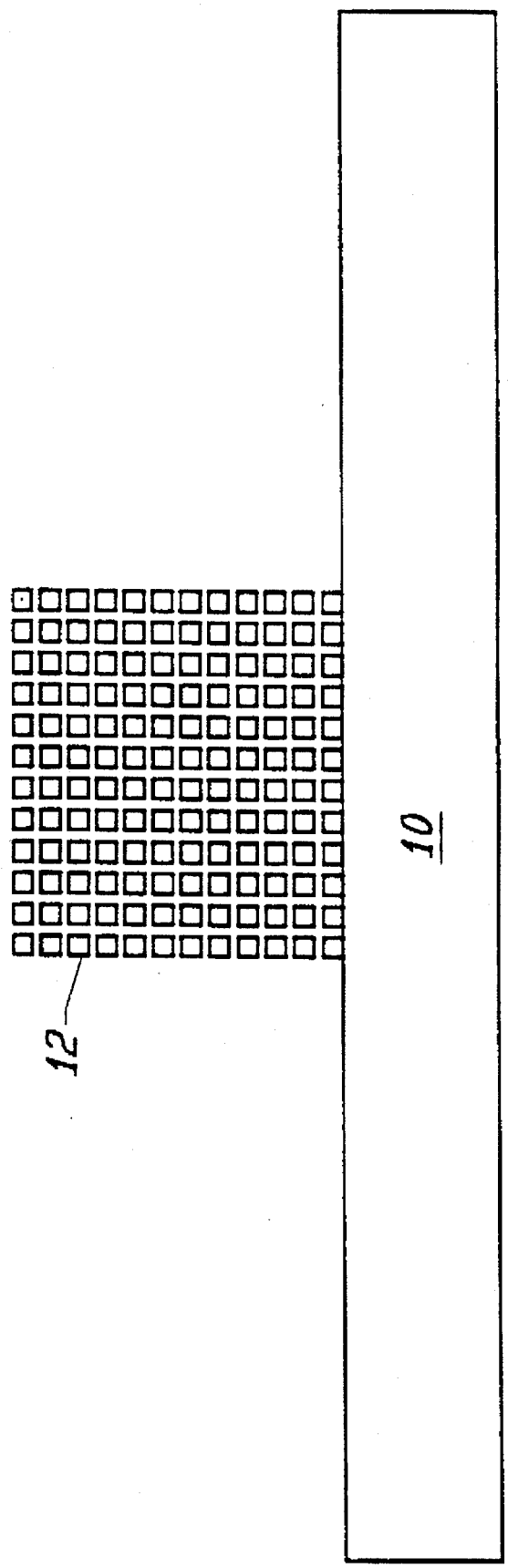
FIG. 3 is a cross-section view of the quantum bridge structure FIGS. 1 and 2 taken along the line 3—3 in FIG. 2.

Referring to the drawings, FIGS. 1, 2, and 3 are a top view, side view, and cross-section view of a quantum bridge structure in accordance with one embodiment of the invention. The structure is fabricated on a supporting substrate 10 of silicon, or a substrate on which a buffer layer of silicon can be grown. The bridge structure includes a plurality of silicon wires 12 which are supported at either end by superlattice germanium-silicon columns 14. Electrical contacts to the quantum wires 12 are provided by implanted dopant ions in the superlattice supports 14 with suitable metal contacts 16 provided on the superlattice supports 14.

The quantum bridge is a mesa structure on the supporting substrate formed by removing by etching surrounding material. The quantum wires 12 are fabricated by etching parallel trenches perpendicular to the plane of the superlattice layers and then removing by preferential etchant the alternating layers of germanium in the superlattice. Thus, in the top view of FIG. 1 the trenches down to the substrate are visible while the side view of FIG. 2 illustrates the superlattice layering of the structure with the wires in the middle portion of the structure formed by removing selectively etched germanium between the silicon wires. In the unetched areas the superlattice remains intact as grown to provide supports and low resistance paths to the silicon wires.

FIG. 3 shows a cross-section of the quantum wire structure taken along the line 3—3 of FIG. 2. The number of rows and columns of wires can be varied as can be the cross-sectional shape and dimensions of the wires. While the wires are illustrated as uniformly spaced, the spacing between wires both vertically and horizontally is readily varied by process control. The vertical height of the wires, vertical spacing between wires, and number of rows are varied by changing the thicknesses and numbers of layers epitaxially deposited. Horizontal width of the wires, horizontal spacing between wires, and the number of wires are varied by changing the width, spacing, and the number of trenches.

Further, all wires need not have the same dimensions. Varying dimensions within one structure can lead to possible additional beneficial effects, such as luminescence over a broader wave length spectrum.

Figure 4:
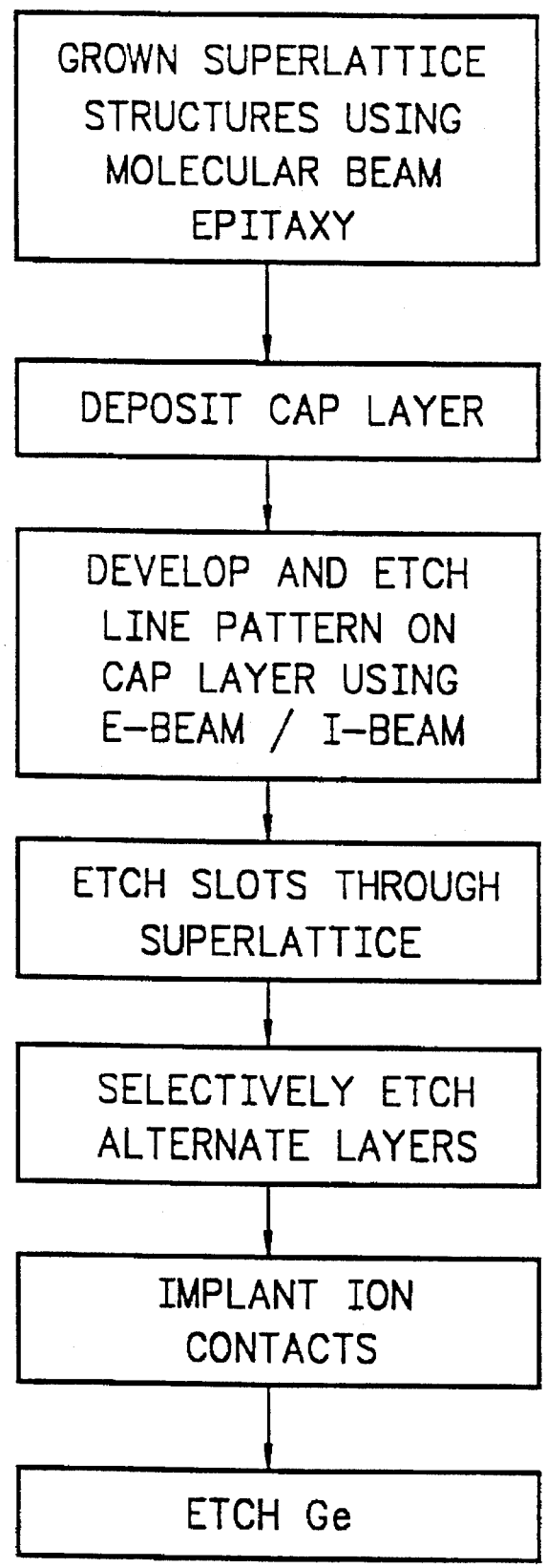
FIG. 4 is a flow diagram of a process for fabricating the quantum bridge structure in accordance with the invention.

FIG. 4 is a process flow in the fabrication of the quantum bridge structure in accordance with one embodiment of the invention. Initially, the superlattice layers are grown on a supporting substrate by using molecular beam epitaxy. The supporting substrate includes a silicon substrate or a silicon buffer layer of 3,000 Å on a supporting substrate. Next a 2.5 micron silicon to $Si_{.5}Ge_{.5}$ graded buffer is formed on the silicon buffer layer. A 1.0 micron thick $Si_{.5}Ge_{.5}$ buffer is then formed on the graded buffer. Thereafter, alternating layers of silicon and germanium are epitaxially grown with each layer being on the order of 500 Å in thickness. Alternatively, the alternating layers can comprise the same material silicon, for example, with adjacent layers being distinguished by doping. A layer of undoped silicon can be preferentially etched over doped silicon. For example, ethylenediamine-pyrocatechol-water (EPW) etches highly doped silicon much more slowly than lower doped or undoped silicon.

A cap layer of silicon oxide or silicon oxide/silicon nitride is then formed on the top silicon layer as a hard mask, and a trench pattern is defined thereon using E-beam or I-beam photolithography in developing a photo resist. A tight pitch array of lines can thus be etched through the cap layer. Thereafter, slots are etched through the underlying superlattice structure using a suitable dry etch which can include a number of etching species including $CF_4$, $CHF_3$, $SF_6$ and combinations thereof with $O_2$.

Thereafter, the alternate layers of germanium between the silicon layers are removed by selective wet etching which can consist of a combination of HF, $H_2O_2$, and $H_2O$ which etches germanium considerably faster than silicon. For a superlattice that consists of regions of alternately doped materials, an etchant with an etch rate that is dependent on doping will be employed. One example of this is EPW (ethylenediamine-pyrocatechol-water) which etches highly doped silicon much more slowly than lower doped silicon.

The electrical contacts through the superlattice structures 14 at either end of the bridge are formed by high energy ion implantation through the superlattice structure, preferably before the etching of the germanium layers. Metal bonding contacts 16 are then provided on the top surfaces of the superlattice structures 14.

The resulting bridge structure has many applications as a light emitter, a light sensor, a chemical sensor, and electrical current conductor. A distribution of wave length emissions can be controlled by adjusting pattern dimensions and by surface treatment. For example, luminescence increases with a passivating oxide and almost completely disappears after a dip in hydrofluoric acid to remove the oxide. The change in quantum properties, electrical and light emission and detection, due to chemical adsorption makes the bridge structure suitable for use as a chemical sensor. The precise control over small dimensions of the silicon wires in the bridge structure permits a desired light emission or obstruction of species on a pretreated surface which permits the structure to function as a detector for that species.

While the invention has been described with reference to a preferred embodiment of germanium and silicon superlattice, the invention has applicability to other materials including different doped layers which can be preferentially etched and to III–V materials. Thus, while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of fabricating a quantum bridge structure comprising the steps of
   a) providing a supporting substrate having a monocrystalline surface of a first semiconductor material,
   b) depositing a buffer layer on said monocrystalline surface for stress relaxation,
   c) alternately depositing layers of said first semiconductor material and a second semiconductor material over said buffer layer to form a superlattice structure,
   d) etching trenches through said superlattice structure to form parallel rows of superlattice material and to form end support members for parallel wires, and
   e) selectively etching said second semiconductor material from said parallel rows thereby forming parallel wires of said first semiconductor material, said parallel wires including a plurality of horizontally spaced wires parallel to said monocrystalline surface and a plurality of vertically stacked wires.

2. The method as defined by claim 1 wherein said first semiconductor material is a III–V semiconductor and said second semiconductor material is a III–V semiconductor.

3. The method as defined by claim 1 wherein said first semiconductor layer is a semiconductor material having a first dopant therein and said second semiconductor layer is said semiconductor material with a second dopant therein which differs from said first dopant in at least one of dopant type and dopant concentration.

4. The method as defined by claim 1 wherein said substrate comprises silicon.

5. The method as defined by claim 1 wherein said substrate includes a surface layer of silicon.

6. The method as defined by claim 1 wherein said first semiconductor material is silicon and said second semiconductor material is germanium.

7. The method as defined by claim 6 wherein said buffer layer is a grade layer of $Si_xGe_{1-x}$, where x is the mole ratio.

8. The method as defined by claim 6 wherein said step of etching trenches includes plasma etching and said step of selectively etching includes anisotropic wet etching.

9. The method as defined by claim 8 wherein step c) forms alternating layers of silicon and germanium each on the order of 20 Å–2000 Å in thickness.

10. The method as defined by claim 9 wherein step b) forms a graded buffer layer approximately 2.5 μm in thickness and a $Si_{.5}Ge_{.5}$ layer approximately 1.0 μm in thickness.

11. The method as defined by claim 1 and further including the step of implanting dopant ions in said end support members for electrical contact to said parallel wires.

12. The method as defined by claim 11 and further including the step of depositing contact material on said end support members for contacting said implanted dopant ions.

13. The method as defined by claim 1 and further including the step of:
   f) treating surfaces of said wires to alter quantum properties thereof.

14. The method as defined by claim 13 wherein step f) includes forming an oxide layer on said surfaces.

* * * * *